United States Patent [19]
Dargent et al.

[11] 4,106,858
[45] Aug. 15, 1978

[54] LIQUID CRYSTAL DISPLAY APPARATUS

[75] Inventors: Bruno Dargent, Grenoble; Jacques Robert, St. Egreve, both of France

[73] Assignee: Commissariat a l'Energie Atomique, Paris, France

[21] Appl. No.: 788,468

[22] Filed: Apr. 18, 1977

[30] Foreign Application Priority Data

Apr. 30, 1976 [FR] France .............. 76 12996

[51] Int. Cl.² .............. G02F 1/13
[52] U.S. Cl. .............. 350/332; 350/336; 350/346
[58] Field of Search .............. 350/332, 333, 336, 346

[56] References Cited

U.S. PATENT DOCUMENTS

| | | | |
|---|---|---|---|
| 3,675,988 | 7/1972 | Soref | 350/336 |
| 3,857,629 | 12/1974 | Freiser | 350/336 |
| 3,979,743 | 9/1976 | Moore | 350/336 |
| 4,009,934 | 3/1977 | Goodwin et al. | 350/346 |
| 4,082,430 | 3/1978 | Schulthess et al. | 350/333 |

*Primary Examiner*—Edward S. Bauer

[57] ABSTRACT

An analog liquid crystal display apparatus comprising a liquid crystal film band inserted between a first conductive electrode and a second resistive electrode; a first voltage source is connected between said first and second electrodes; a second power supply is connected between the two ends of the resistive electrode; the liquid crystal presents a first optical state on a first part of the band and a second optical state on the remainder of the band. The liquid crystal is of the type having a critical relaxation frequency which is either a load relaxation frequency or a dielectric relaxation frequency, the first power supply supplying a voltage at a first frequency and the second power supply supplying a voltage at a second frequency, said two frequencies being on either side of said critical frequency; one of the voltage is then a display voltage and the other is a voltage which inhibits the display.

5 Claims, 7 Drawing Figures

LIQUID CRYSTAL DISPLAY APPARATUS

BACKGROUND OF THE INVENTION

The present invention relates to an analog liquid crystal display apparatus. It is employed in the field of electrooptics, particularly in the display of magnitudes such as voltages, speeds, times, etc.

The apparatus according to the invention comprises a liquid crystal film band inserted between a first conducting electrode and a second resistive electrode. A first power supply is connected between the electrodes and a second power supply is connected between the two end of the resistive electrode.

In such an apparatus, the two voltages applied cooperate in the excitation of the liquid crystal which generally has a diffused state over part of the band and a transparent state over the rest of the band. Depending on the particular case in question, it is possible to obtain either a band divided into two parts, having different optical states separated by a boundary or a band of a first optical state having a portion with a second optical state. The length of the diffused part in the first state and the position and width of the portion in the second state are a function of the values of the two voltages applied and thus constitute an analog representation of one of the voltages when the other is fixed.

In connection with such apparatuses, reference can be made to the article by R. A. Soref entitled "Electronically Scanned Analog Liquid Crystal Displays", published in the Journal "Applied Optics" in June 1970, Volume 9, No. 6, page 1323.

Such apparatus give satisfaction in a certain number of applications. However, they have the disadvantages of introducing a wide unsharp zone at the boundary between the diffused part and the transparent part.

BRIEF SUMMARY OF THE INVENTION

The object of the present invention is a display apparatus of this type where the band is divided into two parts having different optical states, but which have a much less wide unsharp zone than that encountered in the prior art apparatus, which improves the precision of display.

To this end, the invention combines two electrical excitations, one having the effect of displaying a predetermined optical state (for example, but not exclusively, a diffuse state) and the other having an inhibiting action, that is to say having the effect of displaying a second optical state which differs from the first (for example, 50 but not exclusively, a transparent state). As a result of this combination of two excitation signals of different types, it is possible to make the transition between the first zone where the liquid crystal has a first optical state and a second zone where it has a second optical state much less abrupt.

If the phenomenon used can be, as in the prior art, the light scattering phenomenon, it is also possible to utilise another phenomenon which is the collection orientation of molecules under the action of an electric field.

The invention is based on the main properties of certain liquid crystals when they are excited by an alternating electric field, namely the existence of a relaxation frequency, which can either be a load relaxation frequency when the optical characteristic used is the dynamic scattering mode or a dielectric relaxation frequency when the phenomenon used is the collective orientation of the molecules of the liquid crystal. According to the invention, the voltages applied to the electrode are then respectively at frequencies located on either side of said critical frequency, so that one is a display voltage and the other an inhibiting voltage of said display.

BRIEF DESCRIPTION OF THE DRAWINGS

Other and further objects of the present invention will be apparent from the following description and claims and are illustrated in the accompanying drawings, wherein show:

DETAILED DESCRIPTION OF THE PREFERRED EMBODIMENTS

Figure 1:
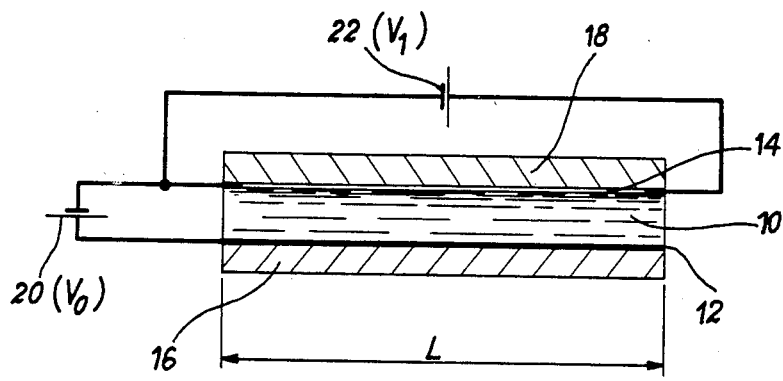
FIG. 1 a schematic sectional view of a prior art apparatus permitting the display of a transparent portion along the light-diffusing liquid crystal band.

FIG. 1 schematically shows a prior art apparatus permitting the display of a diffuse portion whose position is variable along a diffuse band. This apparatus comprises a liquid crystal film 10 inserted between two electrodes 12 and 14, which are generally transparent. Electrode 12 is conductive and electrode 14 is resistive. These electrodes are deposited on the flat wall 16 and 18 respectively. A first power supply 20 supplies a low frequency a.c. or d.c. voltage of amplitude $V_o$. A second power supply 22 supplies a d.c. or a.c. voltage of the same frequency as that supplied by supply 20. The first power supply 20 is connected between electrodes 12 and one of the ends of electrode 14, whilst supply 22 is connected between the two ends of resistive electrode 14.

Figure 2:
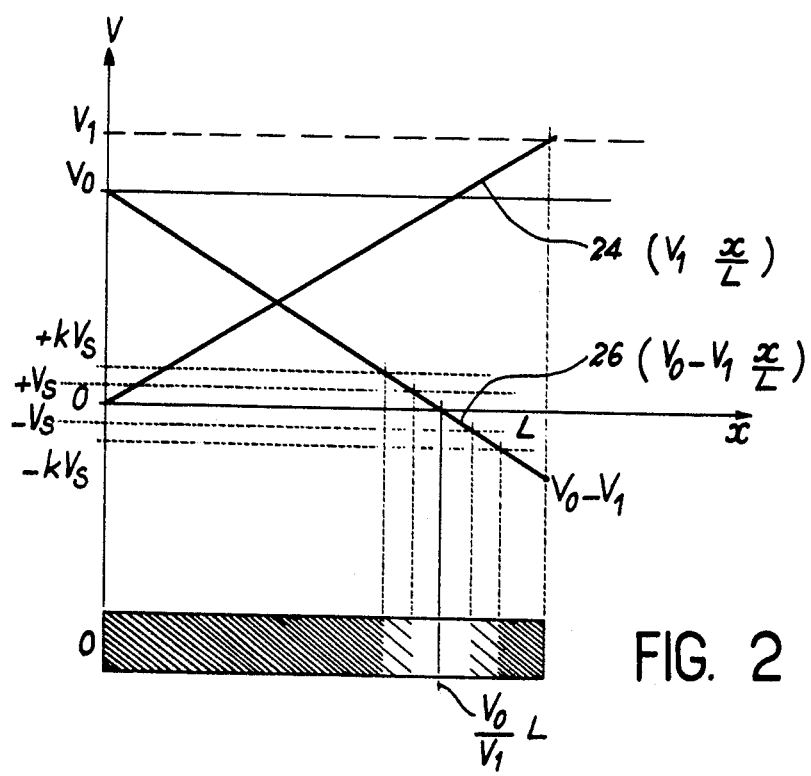
FIG. 2 a diagram explaining the operation of the apparatus of FIG. 1.

The operation of such an apparatus is diagrammatically illustrated by the graph of FIG. 2 where the voltages applied between the electrodes at each point of the liquid crystal band appear on the ordinate, as a function of the abscissa x of this point. The potential along the resistive electrode increases in a linear manner from the value 0 to the value $V_1$, from the left hand end, indicated by 0 on the graph, to the right hand end indicated by L which represents the length of the resistive electrode. This linear variation is represented by the straight line 24 of equation $V = V_1 x/L$.

The voltage $V_o$ supplied by power supply 20 gives rise to a uniform potential of electrode 12 due to the good conductivity of the latter. At an abscissa point located between 0 and L, the liquid crystal is therefore subject to an electric field resulting from the potential difference between the two electrodes at this point and equal to $V_o - V_1 x/L$. The variation in this voltage is illustrated by the straight line 26.

As is known, the dynamic scattering mode has a threshold voltage of value $V_2$. When, in absolute value, the voltage applied between the electrodes exceeds this threshold voltage scattering occurs. The liquid crystal is therefore transparent at the point where the voltage supplied is 0, that is to say at abscissa point $x$ so that $$V_o - V_1 x/L = 0, \text{ or } x = V_o/V_1 L$$

and around this point in a segment such as $$V_o - V_1 x/L < V_s.$$

The above equation makes it possible to determine $x$ and shows that the abscissa $x$ gives a proportional analog representation of voltage $V_o$ if voltage $V_1$ is fixed.

In such an apparatus voltages $V_o$ and $V_1$ are generally low frequency a.c. or d.c. voltages, whereby their common value is below the load relaxation frequency, so that said voltages can induce the effect of the dynamic scattering mode.

With the known apparatus, it is possible to observe an unsharp zone at the boundary between the two zones of the respectively diffuse and transparent liquid crystals. This unsharp zone is due to the fact that the scattering phenomenon, like that of collective orientation does not in practice have an infinitely narrow transition. It is generally considered that the scattering phenomenon has its maximum intensity when the voltage applied is equal to $k$ times the threshold value $V_s$, $k$ being a factor in excess of 1. If reference is made to the graph of FIG. 2, it can be seen that the voltage applied reaches the value $kV_s$ at two abscissa points $x'$ given by $V_o - V_1 x'/L = kV_s$. Thus, there is an unsharp zone of width $x' - x$ at each end of the transparent segment. The above relationship gives for this width the band:

$$x' - x/L = (k - 1) V_s/V_1$$

which can be very large, for example of the order of 10%. It is the width of this unsharp zone which the invention proposes to reduce in order to improve the precision of display.

Figure 3:
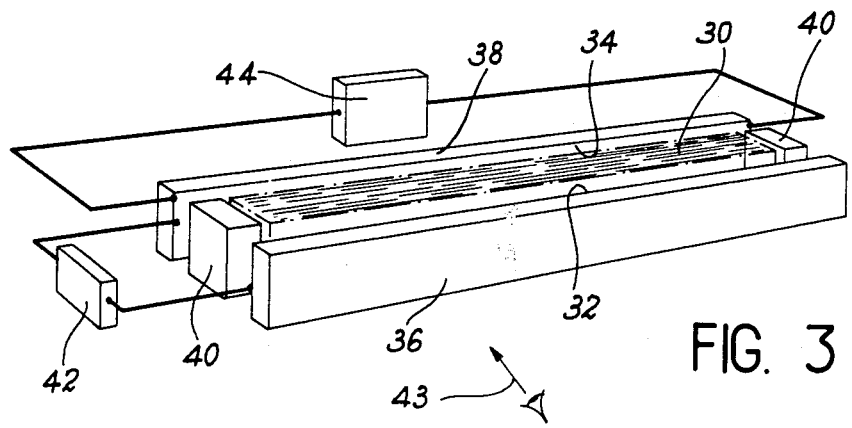
FIG. 3 diagrammatically an exploded view of the apparatus according to the invention.

The display apparatus according to the invention is shown in FIG. 3 and comprises a liquid crystal film 30 inserted between two electrodes 32 and 34, electrode 32 being conductive and electrode 34 being resistive. These electrodes are respectively deposited on the two flat plates 36 and 38, whereby at least one of the plates covered with its electrode is transparent. Shins 40 make it possible to give the liquid crystal film 30 an appropriate thickness. The apparatus is supplied by two power supplies, the first 42 being connected between conductive electrode 32 and resistive electrode 34 and the second 44 being connected between the two ends of the resistive electrode 34. The preferred observation direction is indicated by the arrow 45.

According to the invention, the liquid crystal 30 is of the type having a critical relaxation frequency, either in the form of a load relaxation frequency or in the form of a dielectric relaxation frequency and the power supplies 42 and 44 supply voltages whose frequencies are located on either side of said critical frequencies.

In connection with the existence of a relaxation frequency, reference is briefly made to certain known properties of liquid crystals.

Firstly, it is known that certain liquid crystals can exhibit the phenomenon called the dynamic scattering mode or DSM effect. This scattering is obtained in the frequency of the electrical excitation field is below the relaxation frequency of the ions in transit in the liquid crystal. Beyond this frequency, scattering disappears and the liquid crystal retains its transparency. If it is this phenomenon which is used in the display, the power supplies 42 and 44 supply voltages whose frequencies are located on either side of said ion relaxation frequency.

It is also known that with certain liquid crystals, it is possible to obtain collective orientation phenomena in the molecules under the action of an electrical field. Certain of these liquid crystals have a dielectric relaxation frequency for which the dielectric anisotropy of the molecules changes sign. For example, on this side of said frequency, the anisotropy is negative and on the other side it becomes positive. When an electric field whose frequency is below said critical frequency is applied to the liquid crystal, the major axis of the molecules is oriented in the direction of the field, but for a frequency above said critical frequency, it is the minor axis which is oriented in the direction of the field. These two orientations of the molecules lead to two different optical shapes of the liquid crystal film, for example to two different values of the optical index of the film or to two different rotatory powers of the film. If it is this phenomenon which is used in the apparatus of FIG. 3, power supplies 42 and 44 supply voltages whose frequencies are located on either side of the frequency where the dielectric anisotropy changes sign.

The analog display apparatus according to the invention uses one or other of these two phenomena, namely light scattering or collective orientation of the molecules. However, for explanation purposes only, the following description refers solely to the second of the phenomena the transposition to the first being immediate.

In the case of a liquid crystal subject to the collective orientation of molecules, it is known that the electrical excitation resulting from the superimposing of a low frequency voltage and a high frequency voltage is proportional to an expression having the following values:

$$\epsilon_1 V^2_{BF} - \epsilon_2 V^2_{HF} - \epsilon_1 V^2_s \qquad (1)$$

in which:

$\epsilon_1$ is the low frequency dielectric anisotropy;

$\epsilon_2$ is the high frequency dielectric anisotropy;

$V_{BF}$ is the r.m.s. value of the voltage at a frequency below the dielectric relaxation frequency for which the dielectric anisotropy is cancelled out and which will be called hereinafter the low frequency voltage;

$V_{HF}$ is the r.m.s. value of the voltage at the frequency in excess of the relaxation frequency and called hereinafter high frequency voltage;

$V_s$ is the threshold voltage of the low frequency electrooptical phenomenon.

In order to justify this expression, reference can for example be made to the article by H. K. Bucher et al entitled "Frequency Addressed Liquid Crystal Field Effect", published in the Journal "Applied Physics Letters", Vol. 25, No. 4 of Aug. 15, 1974, page 186 and the article by T. S. Chang, published in the Journal "Applied Physics Letters", Vol. 25, No. 1, July 1, 1974, page 1.

The above expression makes it possible to define a voltage $V_{eq}$ which is equivalent to the simultaneous application of said high and low frequency voltages in the sense that it produces the same excitation. This equivalent voltage is such that:

$$\epsilon_1 V_{eq}^2 - \epsilon_1 V_s^2 = \epsilon_1 V_{BF}^2 - \epsilon_2 V_{HF}^2 - \epsilon_1 V_s^2 \qquad (2)$$

Voltage $V_{eq}$, equivalent to the superimposing of voltages $V_{BF}$ and $V_{HF}$ is therefore given by the relationship:

$$V_{eq}^2 = V_{BF}^2 - \epsilon_2/\epsilon_1 V_{HF}^2 \qquad (3)$$

expression in which the inhibiting function of the voltage $V_{HF}$ is shown clearly with reference to the voltage $V_{BF}$.

When the voltage $V_{HF}$ supplied by the power supply 44 is applied to the ends of the resistive electrodes, the potential which appears at an abscissa point $x$ along the liquid crystal band is a value $(x/L)V_{HF}$.

In the display apparatus of FIG. 3, the equivalent voltage at an abscissa point $x$ is therefore given by the equation:

$$V_{eq}^2 = V_{BF}^2 - \epsilon_2/\epsilon_1 (x^2/L^2) V_{HF}^2 \qquad (4)$$

Figure 4:
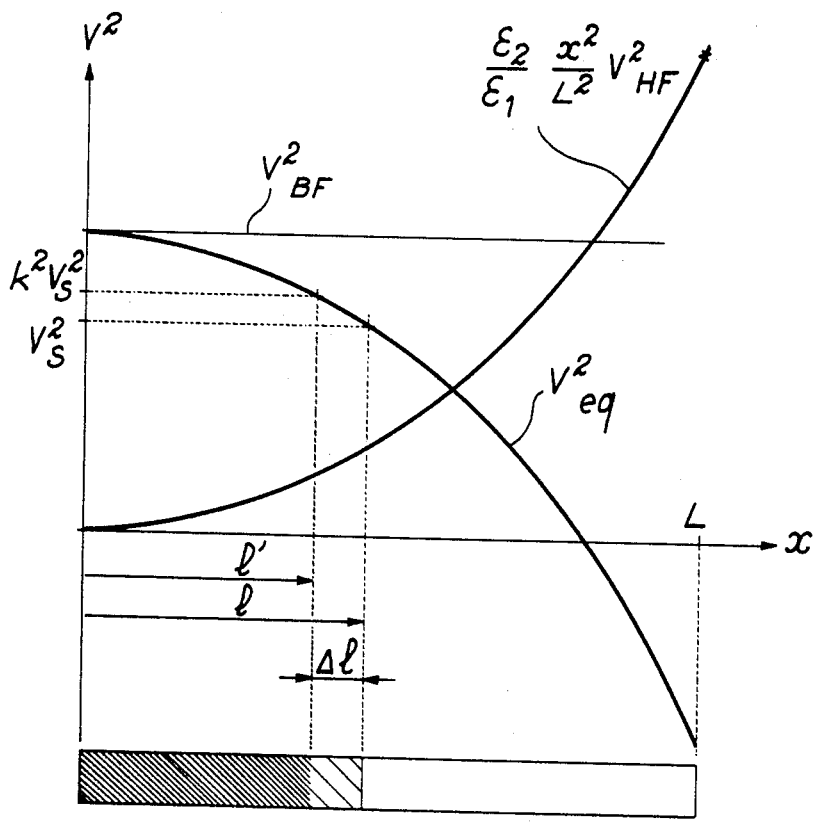
FIG. 4 a diagram explaining the operation of the apparatus of FIG. 3.

The graph of FIG. 4 shows the variation of these different magnitudes where the square of the voltages appears in the ordinate as a function of the abscissa $x$ of the point in question.

In the equivalent voltage which is $V_{eq}$ reaches the threshold voltage $V_s$, the collective orientation phenomenon appears. This occurs at abscissa point $l$ for which we obtain the quality $V_{eq}^2 = V_s^2$. The expression of $l$ results immediately from the preceeding relationship (4):

$$V_{BF}^2 - \frac{\epsilon_2}{\epsilon_1}\left(\frac{l^2}{L^2}\right) V_{HF}^2 = V_s^2 \qquad (5)$$

$$\frac{l}{L} = \frac{1}{V_{HF}} \sqrt{\frac{\epsilon_1}{\epsilon_2}} \sqrt{V_{BF}^2 - V_s^2} \qquad (6)$$

Thus, for any point between 0 and $l$, the liquid crystal band is in a first optical state which is imposed by the low frequency voltage, whose effects cause it to prevail over those of the high frequency voltage. For points between abscissa $l$ and abscissa L it is the high frequency inhibition voltage which prevails and the liquid crystal is in a second optical state.

In actual fact, there is an unsharp zone at the end of the band for reasons indicated hereinafter and the liquid crystal only occurs in the first optical state when voltage $V_{eq}$ exceeds threshold voltage $V_s$ by a coefficient $k$. Equality $V_{eq} = kV_s$ is obtained for an abscissa point $l'$ and it is possible to write as for relationship (5):

$$V_{BF}^2 - \frac{\epsilon_2}{\epsilon_1}\left(\frac{l'^2}{L^2}\right) V_{HF}^2 = k^2 V_s^2 \qquad (7)$$

or:

$$\frac{l'}{L} = \frac{1}{V_{HF}} \sqrt{\frac{\epsilon_1}{\epsilon_2}} \sqrt{V_{BF}^2 - k^2 V_s^2} \qquad (8)$$

The magnitude $\Delta l$ of the unsharp zone is given by $l' - l$ and its expression is deduced from the relationships (6) and (8):

$$\frac{\Delta l}{L} = \frac{1}{V_{HF}} \sqrt{\frac{\epsilon_1}{\epsilon_2}} \left[\sqrt{V_{BF}^2 - V_s^2} - \sqrt{V_{BF}^2 - k^2 V_s^2}\right] \qquad (9)$$

Figure 5:
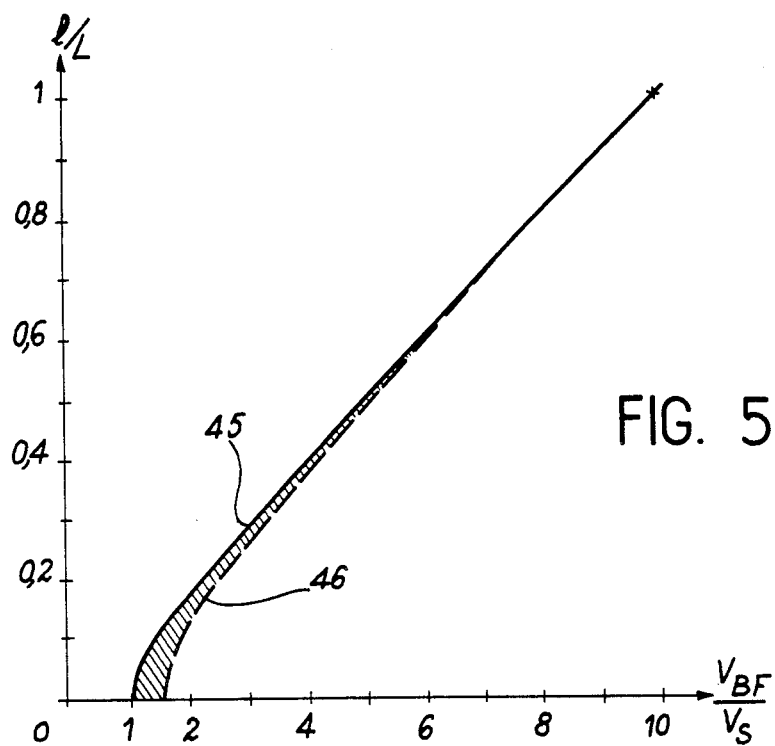
FIG. 5 a graph showing the law of varying the length of the display band as a function of the voltage applied between the electrodes.

Relationship (6) which gives the length $l$ of the band in the first optical state as a function of the low frequency voltage applied (i.e. the analog correspondence between $l$ and $V_{BF}$) is represented by curve 45 of the FIG. 5. The length $l$ appears on the ordinate in relative units with reference to the total length L and low frequency voltage $V_{BF}$ appears on the abscissa with reference to the threshold value $V_s$. The curve shown corresponds to the particular case where $\epsilon_2 V_{HF}^2 = 100 \epsilon_1 V_s^2$. Relationship (6) is then written:

$$1/L = 1/10 (V_{BF}^2/V_s^2) - 1 \qquad (6')$$

When $V_{BF}$ is approximately three times greater than $V_s$, $l$ is essentially given by the linear relationship:

$$1/L = 1/10 (V_{BF}/V_s)$$

Figure 6:
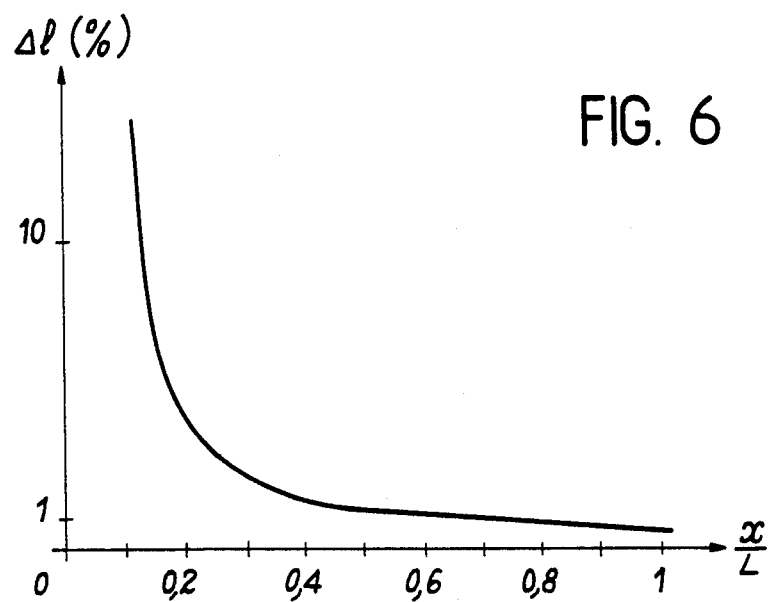
FIG. 6 a graph showing the variation of the width of the unsharp zone as a function of its position in the band.

The graph also has a curve 46 which represents the variations of length $l'$ given by relationship (8) which defines the end of the unsharp zone. This curve is obtained in the same particular case and the value 1.5 is used for the coefficient $k$. The hatched zone therefore corresponds to the unsharp zone. Its width is shown in the diagram of FIG. 6, as a function of the abscissa $x$ of the point in question. This width $\Delta l$ is expressed as a percentage of the total length L.

The curve of FIG. 6 shows that there is a quasi-linear area where the width of the unsharp zone is of the order of 1% of L, whereas with essentially equivalent values, the prior art apparatus have an unsharp zone which greatly exceeds 5% of L. Thus, the invention leads to a very significant improvement.

Figure 7:
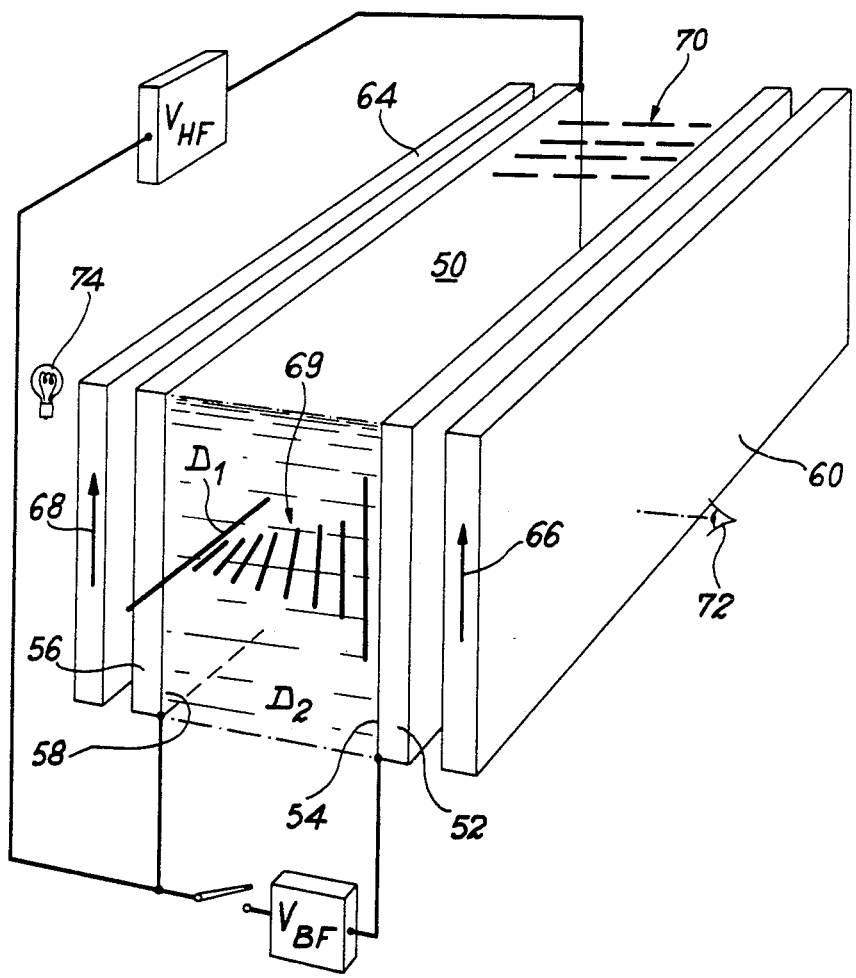
FIG. 7 a variant of the apparatus according to the invention using a liquid crystal of the spiral nematic type.

An exemplified embodiment of the display apparatus according to the invention is shown in a more detailed manner in FIG. 7. This apparatus uses a spiral nematic liquid crystal which is known per se. This apparatus comprises a liquid crystal film 50 inserted between a first transparent wall 52 covered by a first transparent conductive electrode 54 and a second transparent wall 56 covered by a resistive transparent electrode, 58. The two electrodes 54 and 58 have undergone a surface treatment giving them the property of orienting the longitudinal axis of the molecules of liquid crystal 50, in accordance with two different directions $D_1$ and $D_2$, which form between them a given angle, preferably 90°. The system is placed between an analyzer 60 and a polarizer 64, whose directions 66 and 68 are parallel.

In the absence of electrical excitations, the molecules of liquid crystal 50 have their longitudinal axis oriented in direction $D_1$ in the vicinity of electrode 54 and in direction $D_2$ in the vicinity of electrode 58. Within the liquid crystal the orientation of the axis of the molecules passes progressively from direction $D_1$ into direction $D_2$, giving rise to a spiral structure.

This spiral structure is maintained in the presence of an electrical field when the liquid crystal has a negative dielectric anisotropy which is the case with certain nematic liquid crystals and when the voltage applied is a low frequency voltage below the dielectric relaxation voltage for which the anisotropy becomes positive. This is shown schematically in the left hand part of the apparatus in reference zone 69. When the frequency of the electrical field applied is below said relaxation frequency, the dielectric anisotropy of the crystal becomes positive and the longitudinal axis of the molecules of the crystal is aligned with the electrical field. This is shown in the right hand part of the apparatus in zone 70.

In the left hand part of the apparatus the observer 72 is given no light from light source 74 due to the presence of the spiral structure in the liquid crystal film.

Thus, all the band in which the high frequency voltage prevails over the low frequency voltage appears black to the observer. Conversely, the right hand part where the low frequency voltage prevails over the high frequency voltage, corresponds to a transparent zone and the observer 70 receives light from light source 74.

In such an apparatus, no particular problem is caused by the realisation of a transparent resistive electrode. It can be of tin (IV) oxide and have for example a resistance of the order of 10 to 100 kΩ/square. The conductive electrode has a much smaller resistance, for example of the order of 100Ω/square.

In the same way, the surface treatment of electrodes 54 and 58, giving them the property of orienting the longitudinal axis of the molecules of the liquid crystal in accordance with two different directions is known. It can comprise a rubbing operation, an oblique deposition of a substance such as silicon dioxide SiO or impregnated with a surfactant.

The liquid crystal used can for example be a mixture of MBBA (p-methoxybenzylidene-pn-butylaniline) and ABABN (alkoxybenzylidene-amino-benzonitrile).

The frequencies of the voltages applied are on either side of the dielectric relaxation frequency, that is to say essentially on either side of approximately 10kHz. Thus, it is possible to use a voltage $V_{BF}$ of approximately 2kHz and a voltage $V_{HF}$ of about 50kHz.

It is obvious that the unwinding phenomenon of a spiral structure has only been described for illustrative purposes and it is possible to use other phenomena such as for example changing from an orientation of the molecules parallel to one another and to the electrodes to an orientation of the molecules perpendicular to the electrodes, the unwinding of cholesterin, swinging of the cholesterin planes and electrooptical phenomena known in smectics but also, as has been stated hereinbefore, the dynamic scattering mode. In this case, MBBA can be used as the liquid crystal and the apparatus can be excited by voltages of frequencies on either side of the ion relaxation frequency which is at about 500Hz. It would then be possible to use a first voltage of about 30Hz and a second voltage at about 2kHz. In connection with the effect of superimposing a low frequency voltage and a high frequency voltage in a liquid crystal having a light scattering action, it is possible for example to consult the article by C. R. Stein et al entitled "A Two-Frequency Coincidence Addressing Scheme for Nematic-Liquid-Crystal Displays", published in the Journal "Applied Physics Letters", Vol. 19, No. 9, November 1, 1971.

Obviously, the liquid crystal band of the apparatus according to the invention does not exclusively have a rectilinear configuration and can in fact have any appropriate configuration for the display of a magnitude and in particular it can be concave or quasi-circular. A circular band is particularly suitable for time displays. The apparatus then assumes the shape of a dial, whose periphery comprises a band having two different optical states, whereof one is the analog representation of time past. The liquid crystal can also have the shape of a rectangle limited on two of its facing faces by an electrode system of the type defined hereinbefore. The display then has two dimensions, the boundary between the two zones of different optical states moving as a function of two controlled voltages, whereby each is applied to one of the electrode systems.

In a more general manner, the liquid crystal can have various shapes and the electrodes various configurations, provided that the extent of the circuit having a predetermined optical state for the position of the boundary between two surfaces having two different optical states is a representation of at least one magnitude. It is also obvious that any magnitude can be represented in analog manner by the apparatus according to the invention, provided that it is previously converted into a voltage.

The invention is not limited to the embodiments described and represented hereinbefore and various modifications can be made thereto without passing beyond the scope of the invention.

What is claimed is:

1. An analog liquid crystal display apparatus comprising a liquid crystal film band inserted between a first conductive electrode and a second resistive electrode, a first voltage source connected between said first and second electrodes, a second power supply connected between the two ends of the resistive electrode, the liquid crystal then having a first optical state on a first part of the band and a second optical state on the remainder of the band, the length of said first part being a function of the value of the two voltages applied and thus constituting an analog representation of one of the voltages when the other is fixed, wherein the liquid crystal is of the type having a critical relaxation frequency which is either a load relaxation frequency or a dielectric relaxation frequency, the first power supply supplying a voltage at a first frequency and the second power supply supplying a voltage at a second frequency, said two frequencies being on either side of said critical frequency, whereby one of the voltages is then a display voltage and the other is a voltage which inhibits the display, the liquid crystal then having a first optical state over that part of the band where the display voltage prevails over the inhibition voltage and a second optical state over the remainder of the band, the length of said parts constituting the analog representation of the display voltage when the inhibition voltage is fixed.

2. An apparatus according to claim 1, wherein the liquid crystal exhibits the light scattering phenomenon when it is excited by an electrical field whose frequency is below the so-called load relaxation critical frequency, the first power supply supplies a low frequency voltage which is below the load relaxation frequency and the second power supply supplies a high frequency voltage above the load relaxation frequency and that part of the liquid crystal band where the effects of the low frequency voltage prevail over the effects of the high frequency voltage then exhibits said light scattering phenomenon, whilst the remainder of the band retains its transparency, the length of the diffuse part of the apparatus constituting the analog representation of the low frequency voltage.

3. An apparatus according to claim 1, wherein the liquid crystal exhibits the phenomenon of the collective orientation of molecules, according to which the molecules of the liquid crystal are oriented in a first direction when subjected to an electrical field of frequency below the critical frequency, called the dielectric relaxation frequency, for which the dielectric anisotropy of the molecules changes sign and in a perpendicular direction when the frequency of said field exceeds the critical frequency, the first power supply supplies a low frequency voltage below the dielectric relaxation frequency, whilst the second power supply supplies a high frequency voltage above the dielectric relaxation frequency, and that part of the liquid crystal band where the effects of said low frequency voltage prevails over the effects of said high frequency voltage is then in a first optical state corresponding to said first direction of the molecules, the remainder of the band being in a second optical state corresponding to the perpendicular direction, the length of that part of the band which is in the said first state constituting the analog representation of the low frequency voltage.

4. An apparatus according to claim 3, wherein the liquid crystal is of the nematic type.

5. An apparatus according to claim 4, wherein the electrodes have a surface state inducing a spiral structure for the molecules of the nematic crystal.

* * * * *